United States Patent [19]

Bakermans et al.

[11] 4,345,955
[45] Aug. 24, 1982

[54] PROCESS FOR MANUFACTURING MULTILAYER CERAMIC CHIP CARRIER MODULES

[75] Inventors: Frank C. Bakermans, Shiremanstown; Lee R. Conrad, Lewisberry, both of Pa.

[73] Assignee: E. I. Du Pont de Nemours and Company, Wilmington, Del.

[21] Appl. No.: 307,657

[22] Filed: Oct. 2, 1981

Related U.S. Application Data

[63] Continuation-in-part of Ser. No. 201,469, Oct. 28, 1980, abandoned.

[51] Int. Cl.³ .................... B32B 31/06; C04B 39/12; C04B 35/10
[52] U.S. Cl. ........................................ 156/89; 264/61
[58] Field of Search ........................... 156/89; 264/61

[56] References Cited

U.S. PATENT DOCUMENTS

| | | | |
|---|---|---|---|
| 3,991,029 | 11/1976 | Adelman | 260/29.6 TA |
| 4,101,710 | 7/1978 | Marcus | 428/472 |
| 4,197,118 | 4/1980 | Wiech | 264/63 X |

*Primary Examiner*—James R. Hoffman

[57] ABSTRACT

Preparing multilayer ceramic (MLC) modules by injection molding a mixture of a fine particulate such as alumina and a binder into a mold containing predesigned ridges and pins. The product is a green body layer of ceramic containing grooves and vias that is thereafter metallized with a conductive paste and laminated to other like layers of ceramic. Solvent extraction of the binder and sintering of the MLC forms the module.

10 Claims, 6 Drawing Figures

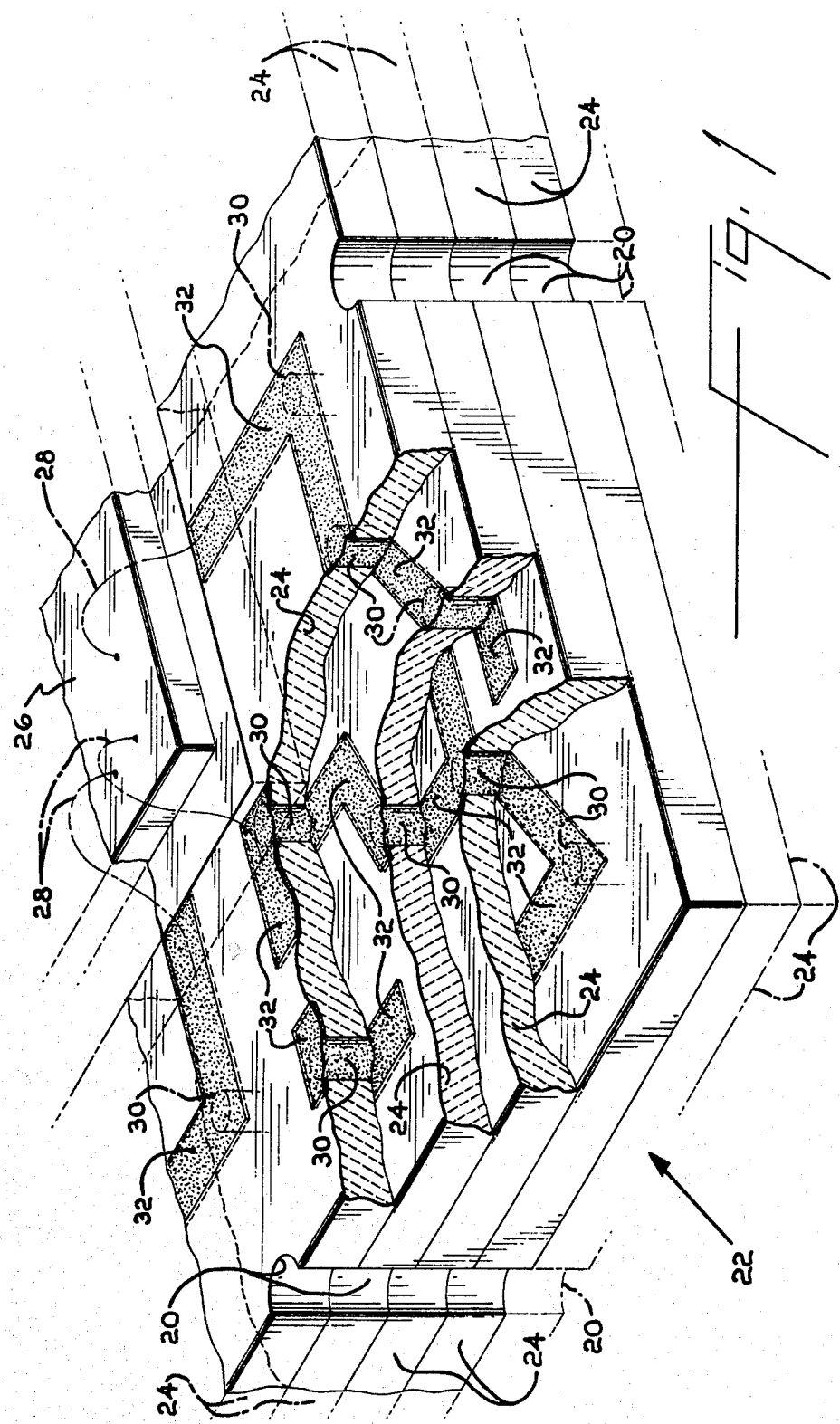

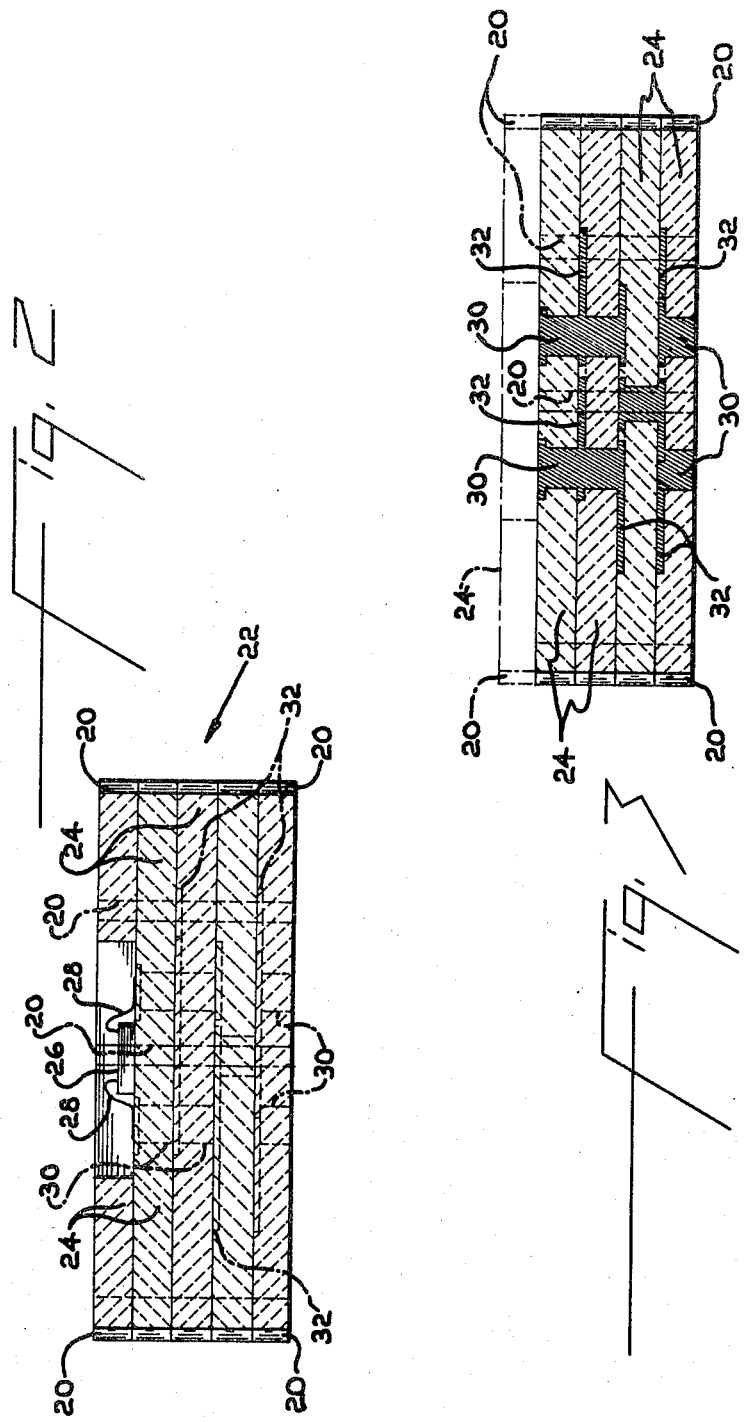

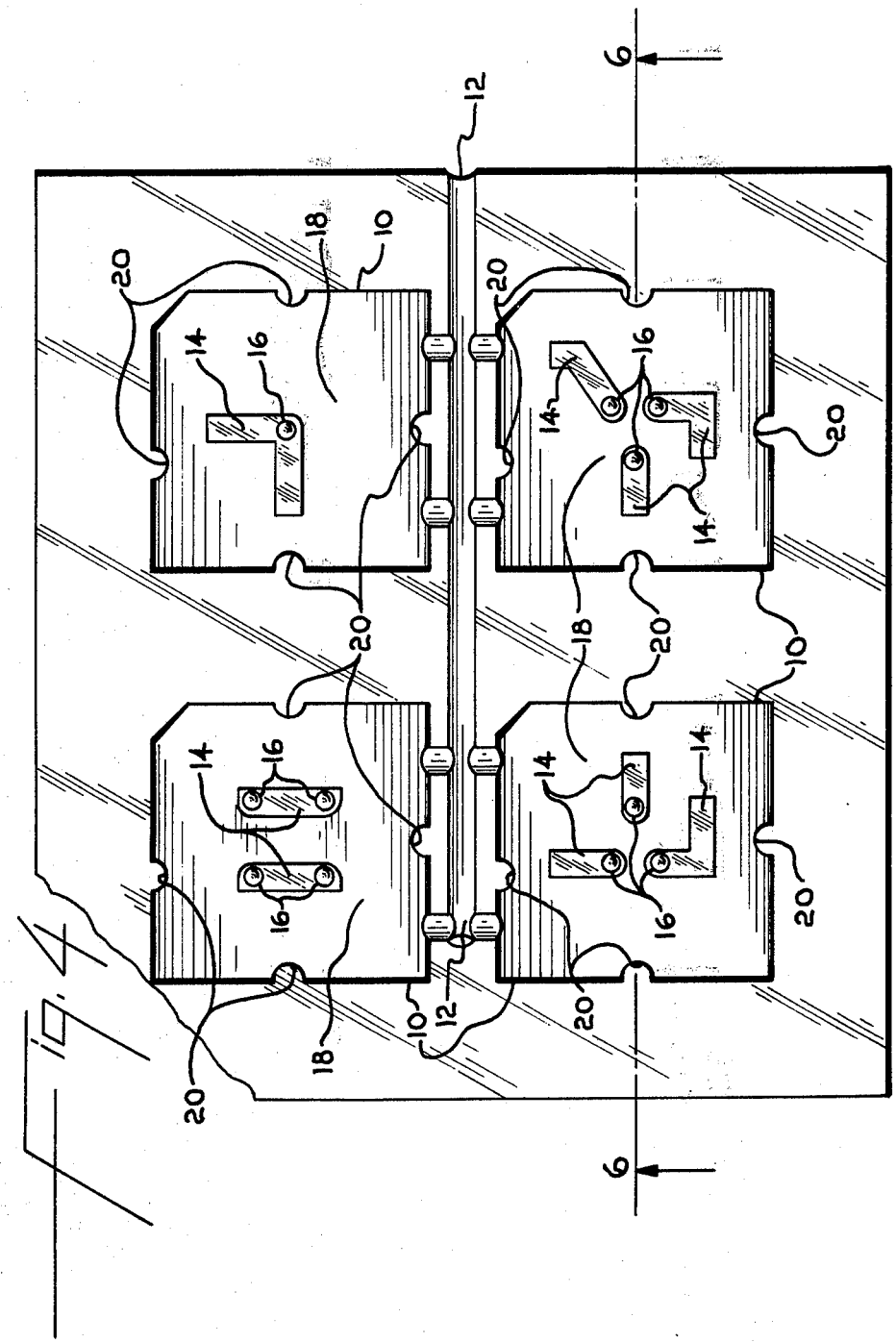

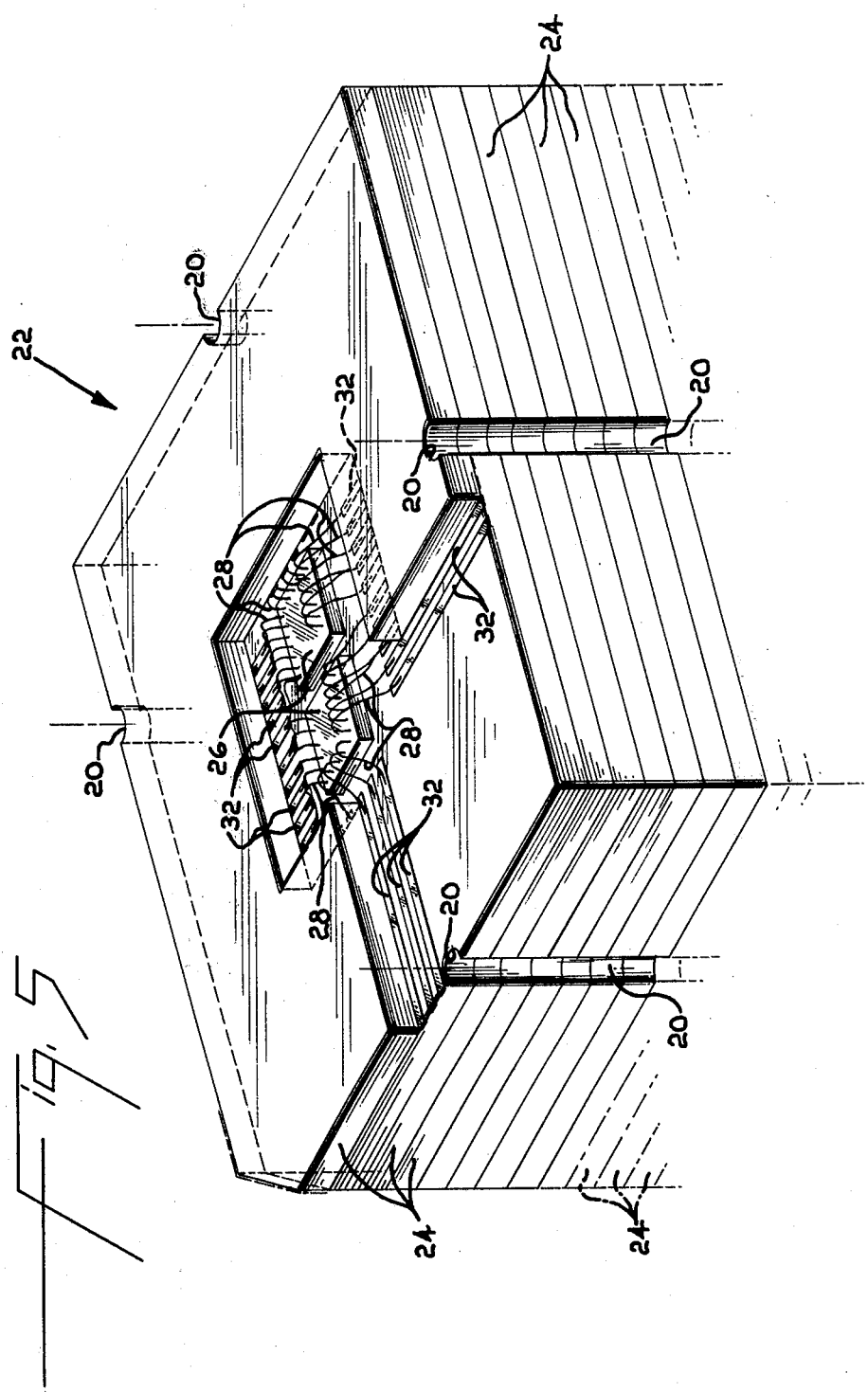

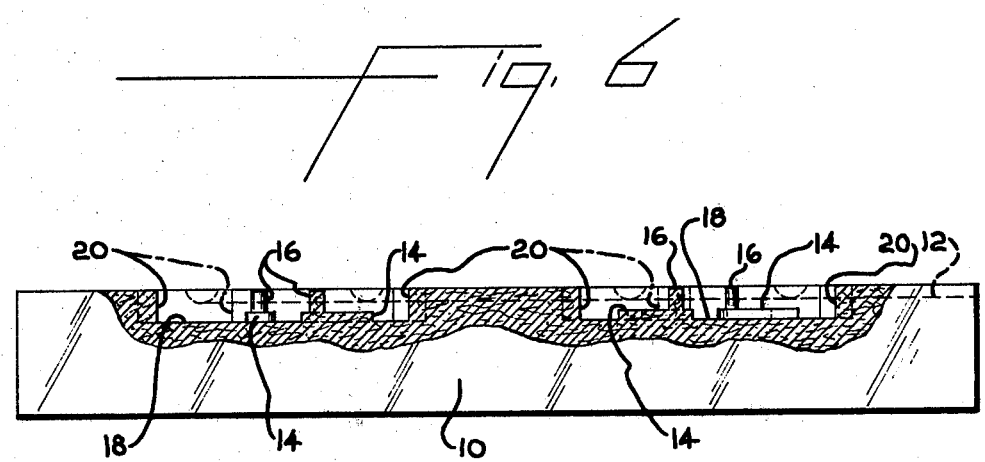

PROCESS FOR MANUFACTURING MULTILAYER CERAMIC CHIP CARRIER MODULES

CROSS REFERENCE TO PRIOR APPLICATION

This application is a continuation-in-part of our pending application Ser. No. 201,469 filed Oct. 28, 1980, now abandoned.

BACKGROUND

Carriers for integrated circuits have heretofore been made by layering ceramic sheets and cutting these sheets into approximately one to two inch squares. The squares are thereafter punched with a hole press to produce the required vias and aligning holes used in stacked multilayer ceramic (MLC) modules. Conductive pastes are then applied to each ceramic sheet and the sheets are placed one on top of another, laminated together and sintered. Problems have arisen caused by cracked chip carriers, improper layering of the paste between ceramic sheets, poor control of circuit patterns and poor control of via locations. It is not unusual to have up to 70 percent of ceramic sheets destroyed because of these problems.

I have now discovered a process for producing MLC carrier modules with reduced cracking and good control of layering, paste application, circuit patterns and via locations.

BRIEF DESCRIPTION OF THE INVENTION

The development of advanced technology in making ceramic bodies such as described in U.S. Pat. No. 4,197,118, incorporated herein by reference, has presented opportunities to manufacture MLC modules in novel forms having higher circuit densities. I have discovered that molds prepared using standard mold making techniques can be used to form ceramic layers. These layers can have preformed grooved tracks and via holes which will allow for more concentrated conductive patterning on each layer. The ceramic layers can be stacked and laminated to form an MLC module after the grooves are metallized with conductive paste in accordance with standard procedures such as screen printing, spray coating, dip or brush coating, doctor blading, or vapor deposition. The multilayered module is then sintered to produce the final MLC product suitable for connecting to integrated circuits.

DESCRIPTION OF THE DRAWINGS

FIG. 1 An exploded cut-away quartered view of an MLC module made in accordance with the process of this invention.

FIG. 2 Elevation taken through one side of the MLC module.

FIG. 3 Cross section of a four layer ceramic module.

FIG. 4 Plan view of molds used to make ceramic layers.

FIG. 5 Prospective showing stacked ceramic layers forming an MLC carrier containing two chips.

FIG. 6 An elevation showing the ridges and pins in a mold for making the conductive grooves and vias.

DETAILED DESCRIPTION OF THE INVENTION

A ceramic injection moldable mixture is prepared by mixing approximately 60 to 90 percent by weight of particles, approximately 0.2 to 4 microns in diameter, taken from the following group: $Al_2O_3$, BeO, steatite, mullite, barium titanate or other particulate ceramic compounds, such as set forth in U.S. Pat. No. 3,991,029, with 10 to 40 percent by weight binders such as polyethylene or Carnauba wax in admixture with an organic oil derived from living plant materials such as soybean oil or linseed oil at a temperature above the melting point of the polyethylene or Carnauba wax.

The resulting mixture is injected into molds 10 as shown in FIG. 4 through inlet 12. The molds contain ridges 14 and pins 16 as well as a flat surface 18. Additionally, the mold has aligning knobs 20. A mold 10 containing the mixture of particulate and binder is cooled to a temperature below the melting point of the binder, and the resulting "green body" is removed from the mold.

The exact size of the molds and therefore the resulting "green body" will vary according to the intended final size of the ceramic layer. The mold may be 15–20% larger than the ceramic layer to allow for a precisely calculated shrinkage. A square of 1 to 2 inches (2.5 to 5 cm) is customarily used for each layer in an MLC module. Each mold will be deep enough to make ceramic layers from 0.2 to 0.5 millimeter thick. FIG. 6 shows the raised portion 14 of the mold 10 and the pin 16 in elevation. The grooves and vias produced by the ridge 14 and the pin 16, respectively, provide for increased density of conductive paths throughout each layer of ceramic. The raised portion 14 is about 0.10 mm wide with a gap of at least 0.10 mm between each raised portion 14. The length depends on the contact distance to be covered. The posts 16 are 0.05 to 0.15 mm in diameter with the preferred diameter being about 0.10 mm.

Conductive pastes containing refractory metals such as molybdenum or tungsten, nonprecious metals such as copper or nickel, precious metals such as gold, palladium, silver, platinum or alloys thereof are then applied to the ceramic layers to form a wiring pattern in accordance with a predetermined system for each ceramic layer. Choice of conductive paste depends upon the firing temperature of the ceramic employed. It is important to note that the conductor in the paste may sinter but must not melt at or below the firing temperature of the ceramic. As an example, molybdenum, tungsten or platinum may be used with alumina ceramics and gold, silver, copper or nickel may be used with barium titanate ceramics.

Methods of applying the paste can include screen printing, spray coating, dip or brush coating, vapor deposition or doctor blading. Additional paste compositions including additives therefore are set forth in U.S. Pat. No. 4,101,710. The disclosure is herein incorporated by reference.

It is preferred to apply thick films by means of screen printing. Using the silk screening process, the paste is applied to the ceramic layers through metal masks directly into the grooves 32 and down through the vias 30 as shown in FIGS. 1, 2, and 3.

Stacks of the ceramic layers with the required configurations of conductors, layer-to-layer connections and reference and power planes are laminated together to form individual modules.

The organic oil or wax binder is stripped from the "green body" ceramic layers with a solvent such as cumene, trichloroethylene or FREON TF after applying the conductive pastes and laminating the layers together. The process of stripping the binder is set forth in U.S. Pat. No. 4,197,118. It involves exposing the "green body" first to solvent in the gaseous state and then in the liquid state.

The ceramic "green" layers are fired at 900° C. to 1550° C. to sinter the ceramic. It is preferred, using an alumina ceramic and a tungsten thick film paste, to fire the module at about 1550° C.

Metallized pads for subsequent integrated circuit attachment can be applied before or after sintering with proper choice of metallization. Refractory metals such as tungsten or molybdenum require plating to make them compatible with integrated circuits.

The modules can contain up to 23 or more ceramic layers and as many integrated circuits as space on each module permits.

The completed module with semi-conductors 26 in place is shown in FIG. 5. The semi-conductors are in electrical contact through wires 28 to the conductive paths 32 in each layer 24 of the module 22.

In the following Examples all percents are by weight.

EXAMPLE I

A particle mixture is prepared using alumina (70%) and Carnauba wax (30%) as binder. The alumina has an average particle size of 0.6 micron and a particle size range from about 3 microns to 0.2 microns. The materials are mixed together at a temperature above the melting point of the binder. The binder is then allowed to cool and form the raw material for the forming process. The mixture is subsequently heated and formed in a mold as shown in FIG. 4 with pressure into the desired layer configuration. The layer then hardens by cooling to form the green body layer.

The green body sheets are then metallized by screen printing a conductive paste containing tungsten. The metallized green sheets are stacked using alignment holes 20 to provide multilayers. The multilayers are laminated together at 75° C. with a pressure of approximately 25 megapascals.

The laminated green body is placed in a container and slowly heated to the melting point (85° C.) of the Carnauba wax. Cumene solvent vapors are introduced into the container to strip out the Carnauba wax binder. The solvent is entered into the chamber at a rate sufficiently slow so that the swelling caused by the solvent on the binder is not sufficient to cause cracking or breaking of the green body. Layer configuration will dictate the time for gaseous treatment.

At the end of the gaseous binder removal, the green body is placed in a liquid solution of the same solvent at a temperature above the melting point of the binder whereby the remaining binder is removed. It should be understood that some binder remains to provide strength for the laminated green body.

The remaining binder and solvent (if any remains) are removed by a low temperature burn. The laminated green body is placed in an oven and the temperature is raised slowly to a point slightly above the boiling point of the binder. The temperature is then raised to 100° C. for one hour to remove any water which may have entered into the green body. The temperature is then raised to 350° C. in a wet dissociated ammonia atmosphere for three days to burn out all remaining binder. The sample is then kiln fired in dissociated ammonia atmosphere at 1540° C. for one hour and then cooled. The heating and cooling cycle takes 24 hours, 18 hours of which are required to reach the 1540° C. sintering temperature. The resultant module has excellent dimensions and electrical circuitry.

EXAMPLE II

The steps of Example I are repeated except substituting a binder system of soybean oil and Carnauba wax. The leaching agent is Freon TF. The green body is metallized, slow burned and fired as described in Example I to form an MLC module.

EXAMPLE III

The steps of Example II are repeated using trichloroethylene to leach out the Carnauba wax binder and provide an essentially binder free green body. The burn off step is eliminated and after firing as described above an MLC module is produced.

EXAMPLES IV THROUGH X

Example I is repeated using particulate mixtures as follows:

| Example | Alumina | Talc | Kaolin |
|---------|---------|------|--------|
| IV | 99% | 1% | — |
| V | 96 | 4 | — |
| VI | 94 | 6 | — |
| VII | 84 | 16 | — |
| VIII | 94 | 3 | 3% |
| IX | 92 | 4 | 4 |
| X | 80 | 8 | 12 |

Examples IV through X all produce MLC modules.

EXAMPLE XI

The particulate and binder of Example I is prepared as described, injection molded layers are metallized and compression laminated together. The laminate is slowly heated to 400° C. in a wet dissociated ammonia atmosphere and held at this temperature for up to 12 hours to form a bisque. The temperature is then raised to 1540° C. in a dissociated ammonia atmosphere to sinter the particles. An MLC module is produced.

EXAMPLE XII

The steps of Example I are repeated except that the green body is metallized by doctor blading. An MLC module is produced.

EXAMPLE XIII

The steps of Example I are repeated except that 15% polyethylene binder with a melt index of 14 and 15% soybean oil as plasticizer are substituted for the Carnauba wax. The same heating temperature of 85° C. is used with cumene solvent vapors to strip out the soybean oil. The resulting module has excellent dimensions and electrical circuitry.

We claim the following as our invention:

1. A process for producing a multilayer ceramic module for use with integrated circuits comprising:
(a) mixing together a nonconductive particulate material suitable for preparing a ceramic body with a binder at a temperature above the melting point of the binder and injecting said mixture into a mold containing predesigned ridges, heating and pressuring said mixture in the mold and then causing said binder to be hardened by cooling to form a ceramic "green body" layer,
(b) applying a conductive paste to the formed ceramic layer, (c) pressing together two or more of said layers to form a module,
(d) exposing said green body in a vapor of a solvent for said binder and thereafter a bath of a liquid solvent for said binder maintained at a temperature above the melting point of said binder, and
(e) sintering said module.

2. The process according to claim 1 in which the nonconductive particulate material is 60 to 90 percent by weight alumina and the binder is present at 10 to 40 percent by weight.

3. The process according to claims 1 or 2 in which the conductive paste contains tungsten and is screen printed into grooves and vias in the ceramic layer.

4. The process according to claims 1 or 2 wherein the conductive paste contains molybdenum and is screen printed into grooves and vias in the ceramic layer.

5. The process according to claim 1 in which the ceramic is barium titanate and the conductive paste contains gold and is screen printed into grooves and vias in the ceramic layer.

6. The process according to claims 1 or 2 in which the solvent employed is cumene.

7. The process according to claims 1 or 2 in which the conductive paste is applied by doctor blading.

8. The process according to claims 1 or 2 in which the binder is a mixture of polyethylene with a melt index of 14 and an organic oil derived from living plant materials and the conductive paste contains tungsten or molybdenum.

9. The process according to claims 1 or 2 in which the binder is a mixture of Carnauba wax and an organic oil derived from living plant materials and the conductive paste contains tungsten or molybdenum.

10. A process for producing a multilayer ceramic module for use with integrated circuits comprising:
(a) mixing together a nonconductive particulate material suitable for preparing a ceramic body with a binder at a temperature above the melting point of the binder and injecting said mixture into a mold containing predesigned ridges, heating and pressuring said mixture in the mold and then causing said binder to be hardened by cooling to form a ceramic "green body" layer,
(b) applying a conductive paste to the formed ceramic layer,
(c) pressing together two or more of said layers to form a module,
(d) exposing said green body at a temperature and for a time period sufficient to burn out said binder, and
(e) sintering said module.

* * * * *